US010026835B2

(12) United States Patent
Tipirneni et al.

(10) Patent No.: US 10,026,835 B2
(45) Date of Patent: Jul. 17, 2018

(54) FIELD BOOSTED METAL-OXIDE-SEMICONDUCTOR FIELD EFFECT TRANSISTOR

(75) Inventors: Naveen Tipirneni, Santa Clara, CA (US); Deva Pattanayak, Saratoga, CA (US)

(73) Assignee: Vishay-Siliconix, San Jose, CA (US)

(*) Notice: Subject to any disclaimer, the term of this patent is extended or adjusted under 35 U.S.C. 154(b) by 929 days.

(21) Appl. No.: 12/824,075

(22) Filed: Jun. 25, 2010

(65) Prior Publication Data
US 2011/0095359 A1 Apr. 28, 2011

Related U.S. Application Data

(60) Provisional application No. 61/255,660, filed on Oct. 28, 2009.

(51) Int. Cl.
*H01L 27/088* (2006.01)
*H01L 29/78* (2006.01)
(Continued)

(52) U.S. Cl.
CPC .... *H01L 29/7813* (2013.01); *H01L 29/42368* (2013.01); *H01L 29/66734* (2013.01); *H01L 29/0878* (2013.01)

(58) Field of Classification Search
CPC ............... H01L 27/088; H01L 29/7813; H01L 29/66734; H01L 29/42368; H01L 29/0878; H01L 29/66; H01L 29/78; H01L 29/02; H01L 29/08; H01L 29/49; H01L 29/06; H01L 29/423; H01L 29/40; H01L 29/10
(Continued)

(56) References Cited

U.S. PATENT DOCUMENTS 3,108,439 A 10/1963 Reynolds et al.
5,298,781 A 3/1994 Cogan et al.
(Continued)

FOREIGN PATENT DOCUMENTS

| CN | 101663760 | 3/2010 |
| JP | 2007-512701 | 5/2007 |
| KR | 1020060052297 | 5/2006 |

OTHER PUBLICATIONS

Van Dort et al., "A Simple Model for Quantisation Effects in Heavily-Doped Silicon MOSFETs at Inversion Conditions", Solid State Electronics, Elsevier Science Publishers, Barking, GB, vol. 37, No. 3, Mar. 1, 1994, pp. 411-414, XP025738937, ISSN: 0038-1101, DOI: 10.1016/0038-1101 (94)90005-1 [retrieved on Mar. 1, 1994.

*Primary Examiner* — Selim Ahmed

(57) ABSTRACT

A trench metal-oxide-semiconductor field effect transistor (TMOSFET) includes a plurality of mesas disposed between a plurality of gate regions. Each mesa includes a drift region and a body region. The width of the mesa is in the order of quantum well dimension at the interface between the gate insulator regions and the body regions The TMOSFET also includes a plurality of gate insulator regions disposed between the gate regions and the body regions, drift regions, and drain region. The thickness of the gate insulator regions between the gate regions and the drain region results in a gate-to-drain electric field in an OFF-state that is substantially lateral aiding to deplete the charge in the drift regions.

20 Claims, 16 Drawing Sheets

(51) Int. Cl.
  *H01L 29/423* (2006.01)
  *H01L 29/66* (2006.01)
  *H01L 29/08* (2006.01)

(58) Field of Classification Search
  USPC .................. 257/329–334, 344, 408, E27.06
  See application file for complete search history.

(56) References Cited

U.S. PATENT DOCUMENTS

| | | | |
|---|---|---|---|
| 5,532,179 A | 7/1996 | Chang et al. | |
| 5,558,313 A | 9/1996 | Hshieh et al. | |
| 5,576,245 A | 11/1996 | Cogan et al. | |
| 5,592,005 A | 1/1997 | Floyd et al. | |
| 5,637,898 A * | 6/1997 | Baliga | 257/330 |
| 5,648,288 A | 7/1997 | Williams et al. | |
| 5,726,477 A | 3/1998 | Williams et al. | |
| 5,750,416 A | 5/1998 | Hshieh et al. | |
| 5,910,669 A | 6/1999 | Chang et al. | |
| 5,981,344 A | 11/1999 | Hshieh et al. | |
| 6,069,043 A | 5/2000 | Floyd et al. | |
| 6,072,216 A | 6/2000 | Williams et al. | |
| 6,090,716 A | 7/2000 | Floyd et al. | |
| 6,285,060 B1 * | 9/2001 | Korec et al. | 257/342 |
| 6,444,527 B1 | 9/2002 | Floyd et al. | |
| 6,696,726 B1 | 2/2004 | Bencuya et al. | |
| 6,906,380 B1 * | 6/2005 | Pattanayak et al. | 257/331 |
| 7,279,743 B2 | 10/2007 | Pattanayak et al. | |
| 7,344,945 B1 | 3/2008 | Pattanayak et al. | |
| 8,183,629 B2 | 5/2012 | Pattanayak et al. | |
| 8,269,263 B2 | 9/2012 | Li et al. | |
| 9,425,043 B2 | 8/2016 | Pattanayak et al. | |
| 9,437,424 B2 | 9/2016 | Pattanayak et al. | |
| 2005/0035401 A1 | 2/2005 | Yamaguchi | |
| 2005/0242392 A1 * | 11/2005 | Pattanayak | H01L 29/407 257/328 |
| 2006/0091455 A1 | 5/2006 | Adan | |
| 2006/0214197 A1 | 9/2006 | Nakamura et al. | |
| 2006/0246650 A1 * | 11/2006 | Williams et al. | 438/212 |
| 2007/0108515 A1 * | 5/2007 | Hueting | H01L 29/7813 257/330 |
| 2008/0073707 A1 | 3/2008 | Darwish | |
| 2008/0166845 A1 * | 7/2008 | Darwish | 438/270 |
| 2008/0230833 A1 | 9/2008 | Zundel et al. | |
| 2008/0246081 A1 | 10/2008 | Li | |

* cited by examiner

| Device | Drift Region Doping, /cm3 | BV, V | Rsp (Vgs=10V), mohm.mm2 | Qg,sp (Vgs=10V), nC/cm2 | Ron.Qg, mohm.nc |
|---|---|---|---|---|---|
| Conventional TMOSFET of Figure 5 | 1.3E+17 | 15.8 | 3.4 | 1522 | 51.74 |
| Proposed Exemplary TMOSFET of Figure4 | 1.3E+17 | 19.2 | 3.54 | 1177 | 41.66 |

FIELD BOOSTED METAL-OXIDE-SEMICONDUCTOR FIELD EFFECT TRANSISTOR

CROSS-REFERENCE TO RELATED APPLICATIONS

This application claims the benefit of U.S. Provisional Patent Application No. 61/255,660 filed Oct. 28, 2009, which is incorporated herein in its entirety.

BACKGROUND OF THE INVENTION

Referring to FIG. 1, a cross sectional perspective view of a trench metal-oxide-semiconductor field effect transistor (TMOSFET) 100 according to the conventional art is shown. The TMOSFET 100 includes, but is not limited to, a plurality of source regions 110, a plurality of gate regions 115, a plurality of gate insulator regions 120, a plurality of body regions 125, a drift region 130, and a drain region 135.

The drift region 130 is disposed between the drain region 135 and the body regions 125. The source regions 110, gate regions 115 and the gate insulator regions 120 are disposed within the body regions 125. The gate regions 115 and the gate insulator regions 120 may be formed as striped or closed cell structures. The gate insulator region 120 surrounds the gate regions 115. Thus, the gate regions 115 are electrically isolated from the surrounding regions by the gate insulator regions 120. The gate regions 115 are coupled to form a common gate of the device 100. The source regions 110 may be formed along the periphery of the gate insulator regions 120. The source regions 110 are coupled to form a common source of the device 100. The source regions 110 are also coupled to the body regions 125, typically by a source/body contact (not shown).

In one implementation, the source regions 110 and the drain region 135 may be heavily n-doped (N+) semiconductor, such as silicon doped with phosphorous or arsenic. The drift region 130 may be lightly n-doped (N−) semiconductor, such as silicon doped with phosphorous or arsenic. The body regions 125 may be p-doped (P) semiconductor, such as silicon doped with boron. The gate region 115 may be heavily n-doped (N+) semiconductor, such as polysilicon doped with phosphorous. The gate insulator regions 120 may be an insulator, such as silicon dioxide.

When the potential of the gate regions 115, with respect to the source regions 110, is increased above the threshold voltage of the device 100, a conducting channel is induced in the body region 125 along the periphery of the gate insulator regions 120. The TMOSFET 100 will then conduct current between the drain region 135 and the source regions 110. Accordingly, the device is in its ON-state.

When the potential of the gate regions 115 is reduced below the threshold voltage, the channel is no longer induced. As a result, a voltage potential applied between the drain region 135 and the source regions 110 will not cause current to flow there between. Accordingly, the device 100 is in its OFF-state and the junction formed by the body region 125 and the drain region 135 supports the voltage applied across the source and drain.

The lightly n-doped (N−) drift region 130 results in a depletion region that extends into both the body regions 125 and the drain region 130, thereby reducing the punch through effect. Accordingly, the lightly n-doped (N−) drift region 130 acts to increase the breakdown voltage of the TMOSFET 100.

The channel width of the TMOSFET 100 is a function of the length of the plurality of the source regions 110 along the periphery of the gate insulator regions 120. The channel length of the device 100 is a function of the body region 125 between the source regions 110 and the drift region 130 along the periphery of the gate insulator regions 120. Thus, the device 100 provides a large channel width to length ratio. Therefore, the TMOSFET device 100 may advantageously be utilized for power MOSFET applications, such as switching elements in a pulse width modulation (PWM) voltage regulator.

SUMMARY OF THE INVENTION

Embodiments of the present technology are directed toward field boosted field effect transistors. The present technology may best be understood by referring to the following description and accompanying drawings that are used to illustrate embodiment of the present technology. In one embodiment, a trench metal-oxide-semiconductor field effect transistor (TMOSFET) includes a drain region, a plurality of gate regions, a plurality of drift regions, a plurality of body regions, a plurality of source regions and a plurality of gate insulator regions. The gate regions are disposed above the drain region. The drift regions are disposed above the drain region in mesas between the gate regions. The body regions are disposed in the mesas, above the drift regions, and adjacent the gate regions. The source regions are disposed in the mesas above the body regions. The gate insulator regions are disposed between the gate regions and the source, body, drift, and drain regions. The width of the mesa is approximately 0.03 to 1.0 microns ($\mu m$). The thickness of the gate insulator regions between the gate regions and the drain region is approximately 0.1 to 4.0 $\mu m$.

BRIEF DESCRIPTION OF THE DRAWINGS

Embodiments of the present technology are illustrated by way of example and not by way of limitation, in the figures of the accompanying drawings and in which like reference numerals refer to similar elements and in which.

DETAILED DESCRIPTION OF THE INVENTION

Reference will now be made in detail to the embodiments of the present technology, examples of which are illustrated in the accompanying drawings. While the present technology will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

Figure 1:
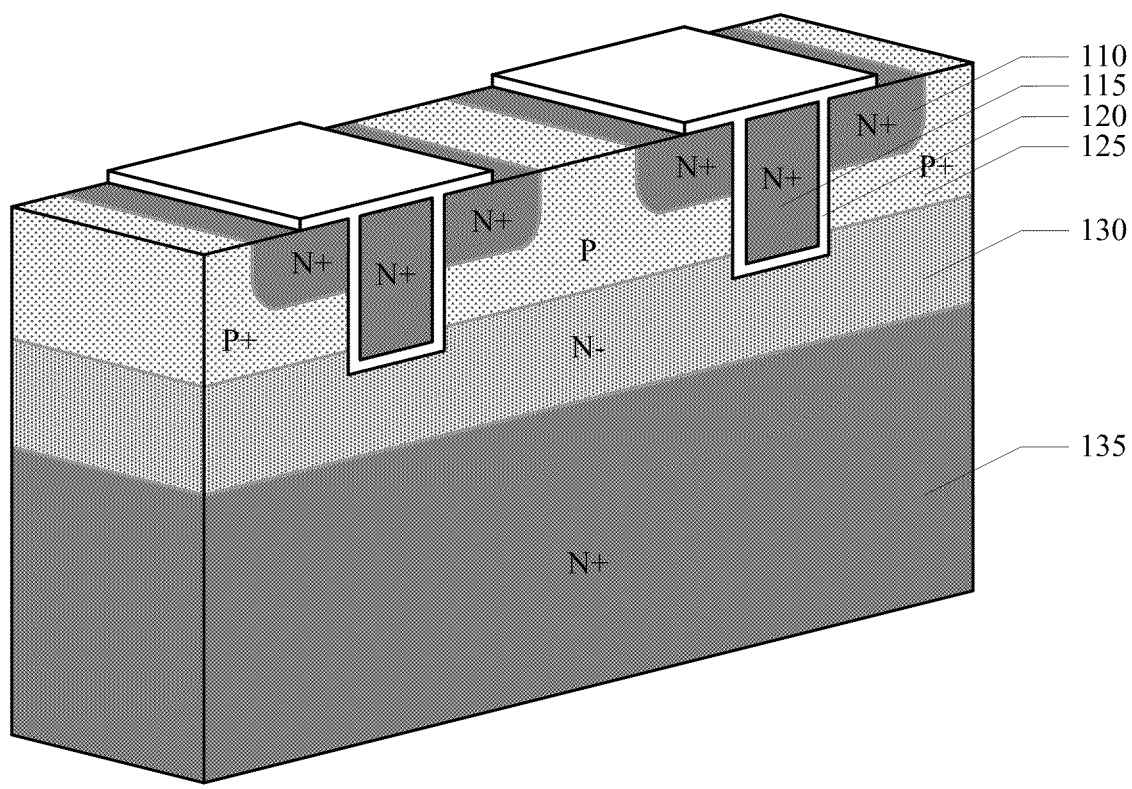
FIG. 1 shows a cross sectional perspective view of a trench metal-oxide-semiconductor field effect transistor (TMOSFET) according to the conventional art.
Figure 2:
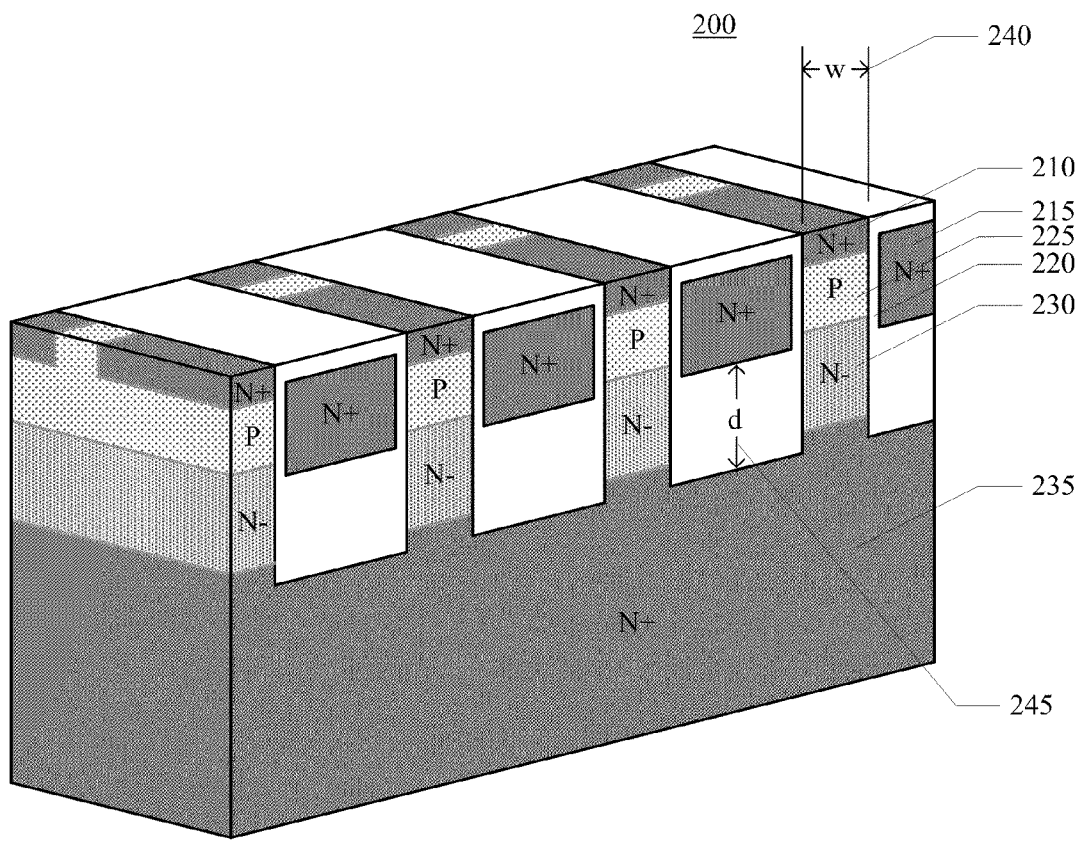
FIG. 2 shows a cross sectional perspective view of a TMOSFET, in accordance with one embodiment of the present technology.

Referring to FIG. 2, a cross sectional perspective view of a trench metal-oxide-semiconductor field effect transistor (TMOSFET) 200, in accordance with one embodiment of the present technology. The TMOSFET 200 includes, but is not limited to, a plurality of source regions 210, a plurality of gate regions 215, a plurality of gate insulator regions 220, a plurality of body regions 225, a plurality of drift regions 230 and a drain region 235.

The drift regions 230 are disposed between the drain region 235 and the body regions 225. The body regions 224 are disposed between the drift regions 230 and the source region 210. The gate regions 215 and the gate insulator regions 220 may be formed as gate/gate insulator structures. The gate insulator regions 220 surround the gate regions 215 and electrically isolate the gate regions 215 from the surrounding regions. The source regions 210, body regions 220 and drift region 230 are disposed in mesas between the gate/gate insulator structures 215, 220. The portion of the body regions 225 disposed between the source regions 210 and the drift regions 230 proximate the gate/gate insulator structure 215, 220 form the channel regions of the TMOSFET.

In one implementation, the drain region 235 may extend up into the mesas between the gate/gate insulator structures 215, 220 as illustrated in FIG. 2. In another implementation, the drift regions 230 may extend beyond the bottom of the mesas between the gate/gate insulator structures 215, 220.

The gate regions 215 are coupled to form a common gate of the device 200. The source regions 210 are coupled to form a common source of the device 200. The body regions 225 are also coupled to the source regions 210. In one implementation, the body regions 225 may extend up to the surface of the mesa periodically along the length of the source regions 210. The source regions 210 and body regions 225 may be coupled together by a source/body contact (not shown).

Figure 3:
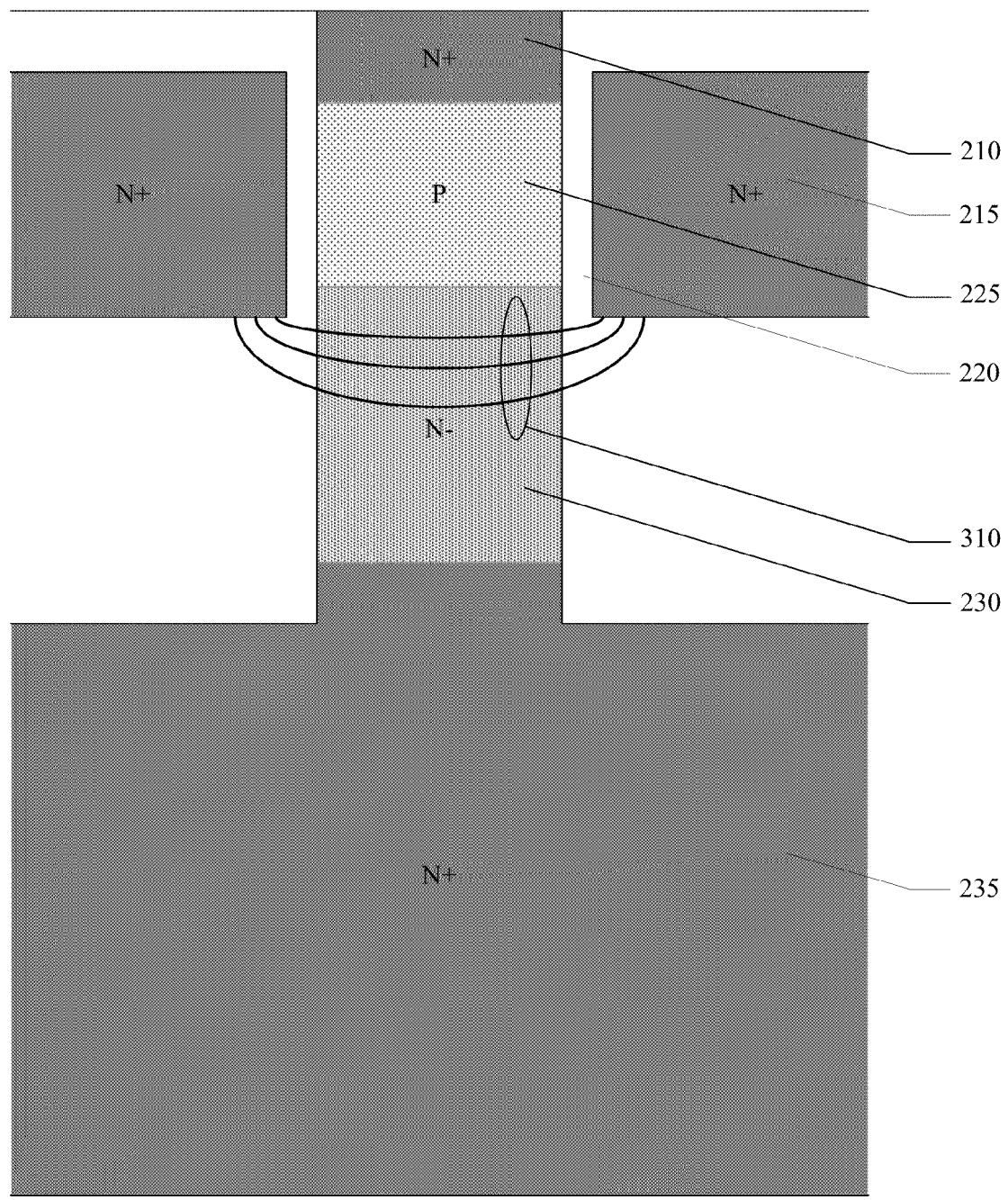
FIG. 3 show an enlarged cross sectional view of a TMOSFET, in accordance with one embodiment of the present technology.

The width 240 of the mesas, between gate/gate insulator structures 215, 220, is substantially in the range of one-tenth (1/10) to one hundred times (×100) the quantum well width formed in the ON-state of the device (e.g., $V_{GS}$ above threshold voltage) at the interface between the body regions 225 and the gate insulator regions 220 (e.g., Si—SiO$_2$ interface), hereinafter referred to as 'in the order of quantum well dimensions.' In one implementation the width 240 of the mesas is approximately two times the quantum well width formed at the interface between the body regions 225 and the gate insulator regions 220 (e.g., Si—SiO$_2$ interface). In one implementation, the width 240 of the mesas is approximately 0.03 to 1.0 μm. The gate insulator regions 220 include a thick portion between the gate regions 215 and the drift region 230 and between the gate regions 215 and the drain regions 235. The gate insulator regions 220 also include a thin portion between the gate regions 215 and the body regions 225. The depth of the thick portion of the insulator regions 220 is selected so that the gate-to-drain electric field 310 in the OFF-state of the device is substantial lateral in the drift regions 230 proximate the body regions 225, as illustrated in FIG. 3. The substantially lateral electric field 310 in the drift regions 230 proximate the body regions 225, in the OFF-state, substantially depletes the charge in the drift regions 230. In one implementation, the depth 245 of the thick portion of the gate insulator regions 220 is substantially in the range of 0.1 to 4.0 μm.

The source regions 210 and the drain region 235 may be heavily n-doped (N+) semiconductor, such as silicon doped with phosphorous or arsenic. The drift region 230 may be lightly n-doped (N−) semiconductor, such as silicon doped with phosphorous or arsenic. In one implementation, the drift region has a graded doping profile that decreases vertically from the drain region to the plurality of body regions and/or varies laterally from the edge of the mesa to the center of the mesa. In another implementation, the drift region has a substantially constant doping profile. In an exemplary implementation, the doping profile is substantially in the range of 1.00E+14 to 8.00E+17 per cubic centimeters. The body regions 225 may be lightly or moderately p-doped (P−, P) semiconductor, such as silicon doped with boron. The gate region 215 may be heavily n-doped (N+) semiconductor, such as polysilicon doped with phosphorous. The gate insulator regions 220 may be silicon dioxide (SiO$_2$).

Figures 4, 5:
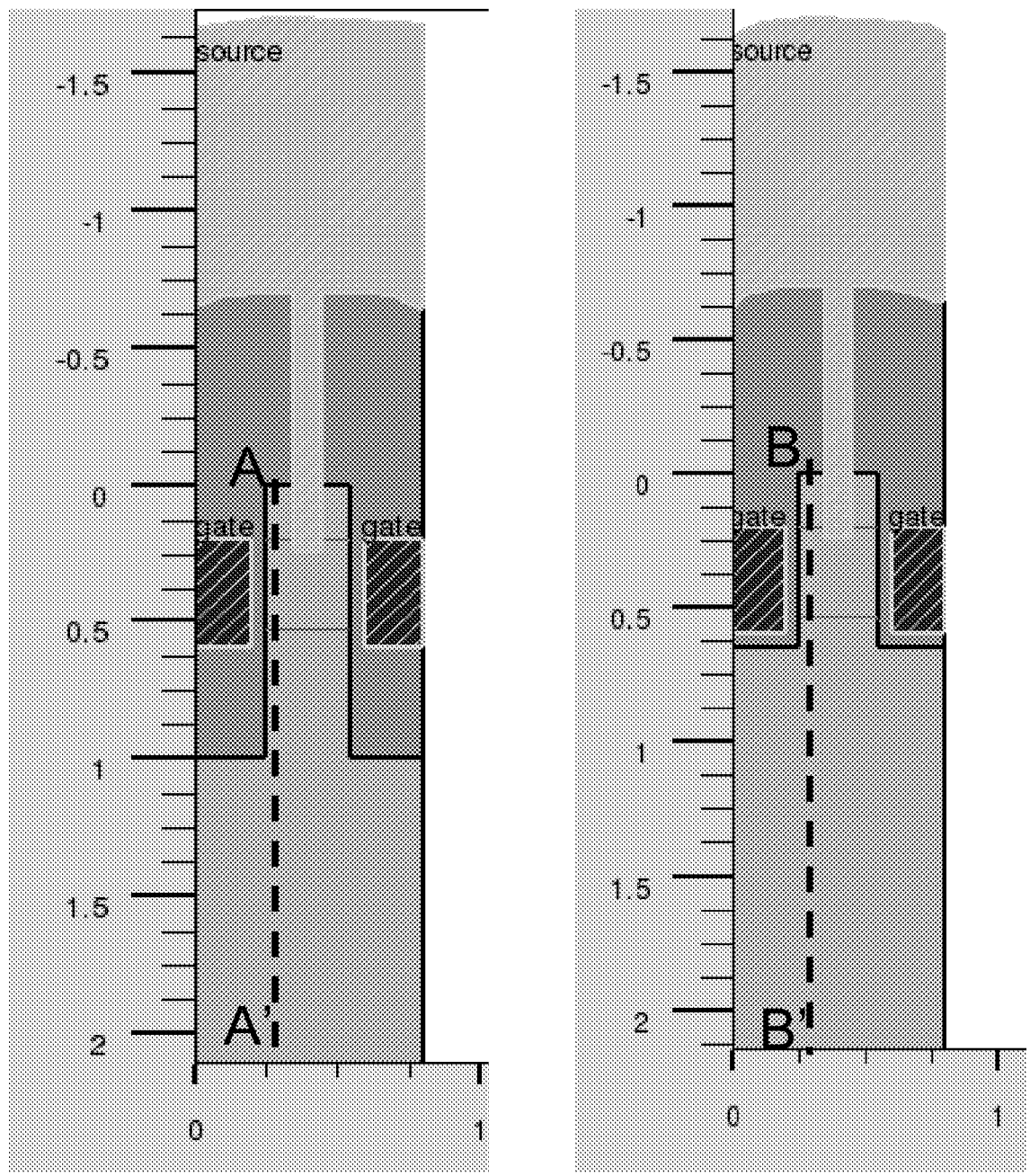
FIG. 4 shows the cross-sectional view of an exemplary TMOSFET having a 0.3 $\mu m$ mesa width and 0.4 $\mu m$ thick gate insulator between the gate regions and the drain region, in accordance with one embodiment of the present technology.
FIG. 5 shows the cross-sectional view of a conventional TMOSFET having a 0.3 $\mu m$ mesa width and 0.05 $\mu m$ thick gate insulator between the gate regions and the drain region, in accordance with conventional art.
Figure 6:
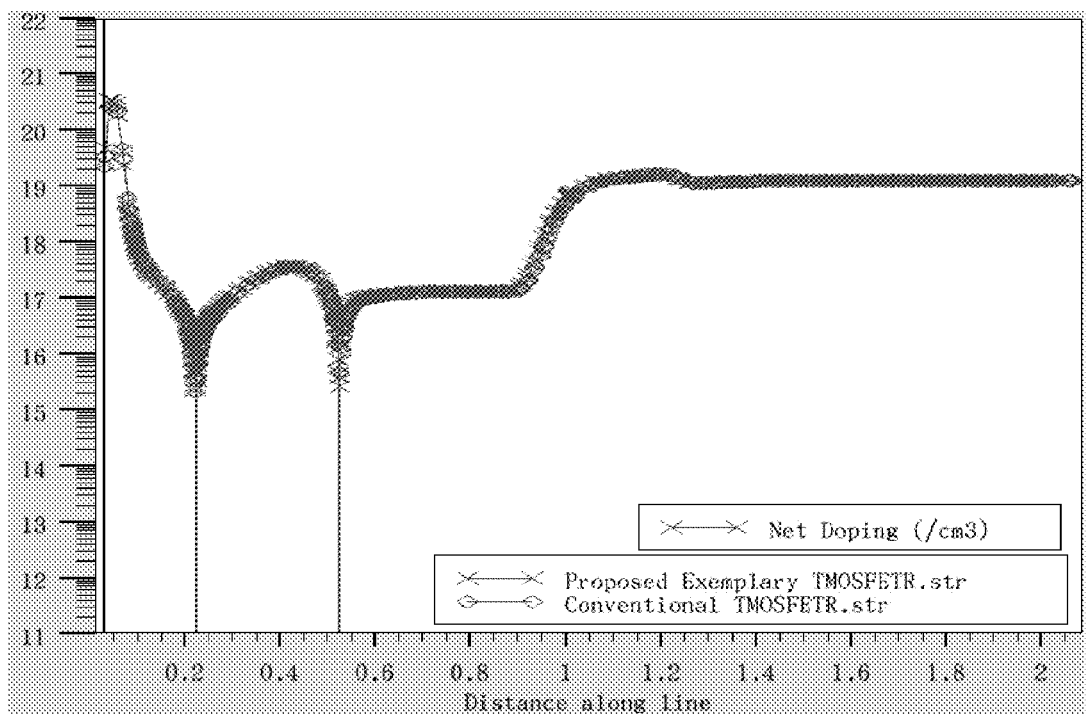
FIG. 6 shows the net doping profile along cutline AA' of the exemplary TMOSFET shown in FIG. 4 and doping profile along cutline BB' of conventional TMOSFET shown in FIG. 5.

A cross sectional view of an exemplary TMOSFET having a 0.3 µm mesa width and 0.4 µm thick gate insulator between the gate regions and the drain region, is shown in FIG. 4. Similarly, a cross sectional view of an exemplary TMOSFET according to conventional art having a 0.3 um mesa width and 0.05 µm thick gate insulator between the gate regions and the drain region, is shown in FIG. 5. Further, the doping profile along cutline AA' in FIG. 4 and cutline BB' in FIG. 5 are compared in FIG. 6.

When the potential of the gate regions 215, with respect to the source/body regions 210/225, is increased above the threshold voltage of the device 200, a conducting channel is induced in the body region 225 along the periphery of the gate insulator regions 220. The TMSOFET 200 will then conduct current between the drain region 235 and the source regions 210. Accordingly, the device is in its ON-state.

Figure 7:
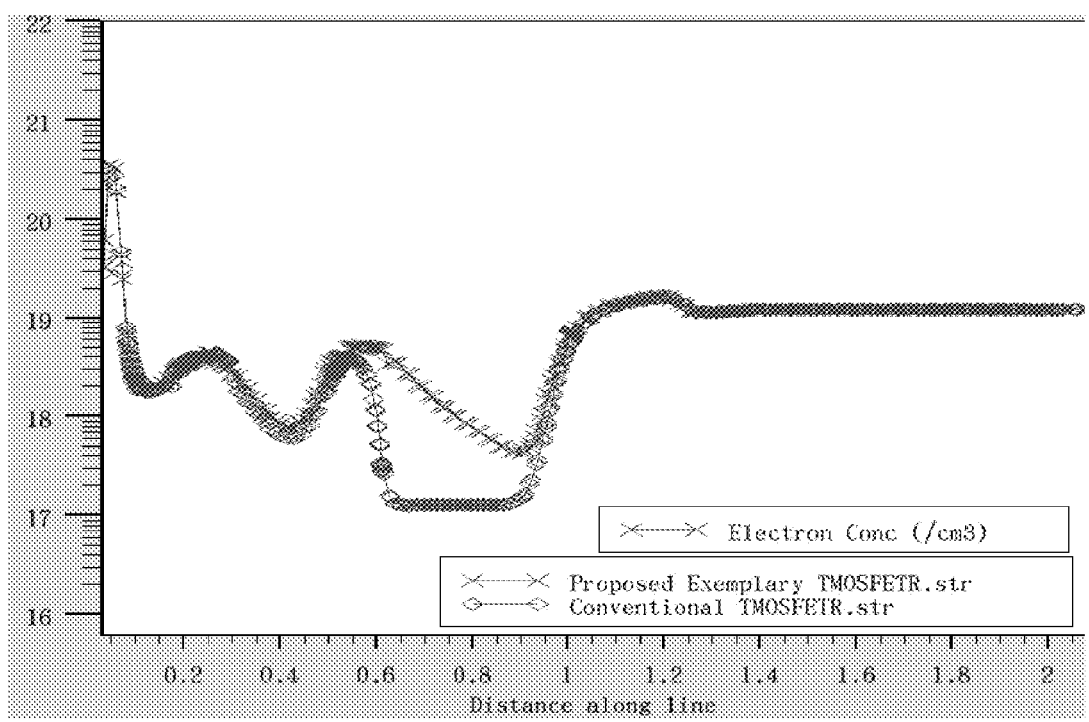
FIG. 7 shows the electron concentration along cutlines AA', BB' of the exemplary TMOSFET shown in FIG. 4 and conventional TMOSFET shown in FIG. 5 respectively, and both in the ON-state with VDS=0.1V and VGS=10V greater than the threshold voltage.

When the mesa width of the body regions is in the order of quantum well dimensions, the body regions in the mesa will be flooded with a high density of electrons (~1e18 cm-3 to 1e20cm-3) having decent mobility due to the inverted silicon interface in the ON-state. Two-dimensional electron gas (2DEG) formation occurs during the ON-state in the body regions and accumulation layer formation occurs in the epitaxial layer in the thin mesa structure due to the gate-drain region fringing electric field. The body regions may be doped at lower concentrations, thus decreasing the effect of ionized impurity scattering on mobility of carriers in this region during ON-state. In the ON-state, the triangular quantum wells forming at the Si—SiO2 interfaces of the body regions in the thin mesa flood the body regions with the high density of electrons. The electron concentration in the ON-state ($V_{GS}$=10V) along the cutline AA' in FIG. 4 and along cutline BB' in FIG. 5 are compared in FIG. 7.

When the potential of the gate regions 215 is reduced below the threshold voltage, the channel is no longer induced. As a result, a voltage potential applied between the drain region 235 and the source regions 210 will not cause any significant current to flow through device 200. Accordingly, the device 200 is in its OFF-state and the junction formed by the body region 225 and the drain region 235 along with the aid of gate-drain field supports the voltage applied across the source and drain.

Figure 8:
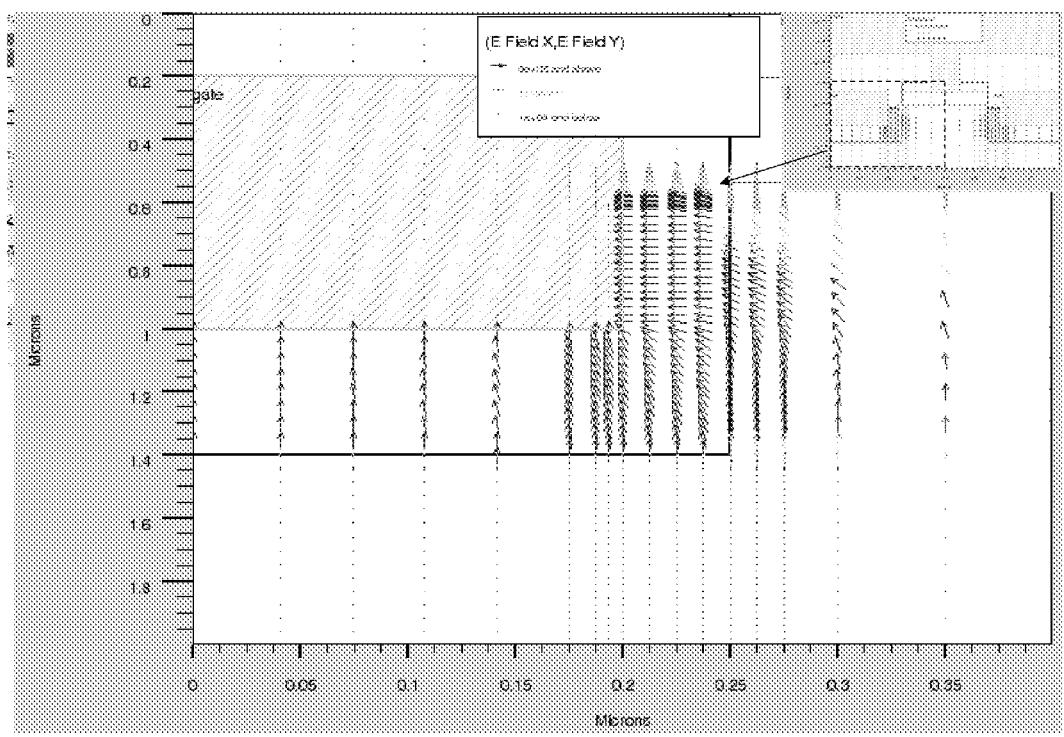
FIG. 8 shows the total electric field vectors under breakdown voltage conditions for the exemplary TMOSFET, with the gate to drain region fringing field aiding the depletion of drift region charge.

In the OFF-state, the voltage present between gate and drain regions result in vertical electrical fields along the thick portion of the gate insulator between the gate regions and the drain region. This vertical electric field decays within a particular lateral distance "L" to substantially small values beyond the lateral edge of the gate regions. The values of the decaying electric field within the particular lateral distance "L" from gate edge depends on the materials present in this region. For the given device 200, placement and dimensions of gate regions 215, drift regions 230 and drain regions 235 are advantageously chosen so that the value of vertical electric field, due to voltage present between gate and drain, in the mesa drift regions 230 is significant. The lateral component of the gate-drain electric field in the mesa region aids in depleting the charge present there and thus providing a field induced reduction of effective charge in the mesa, as illustrated by the total electric field vectors under breakdown conditions for the exemplary TMOSFET (FIG. 4) in FIG. 8. The gate-drain electric field induced effective charge reduction in the narrow width of the mesa allows the doping concentration in the drift region to be increased for a given breakdown voltage. The gate-drain vertical field is effectively transferred into the silicon laterally as long as the mesa is in the order of quantum well dimensions and present close enough to the gate-drain capacitor edge in a region where fields have not decayed significantly in the lateral direction.

Figure 9:
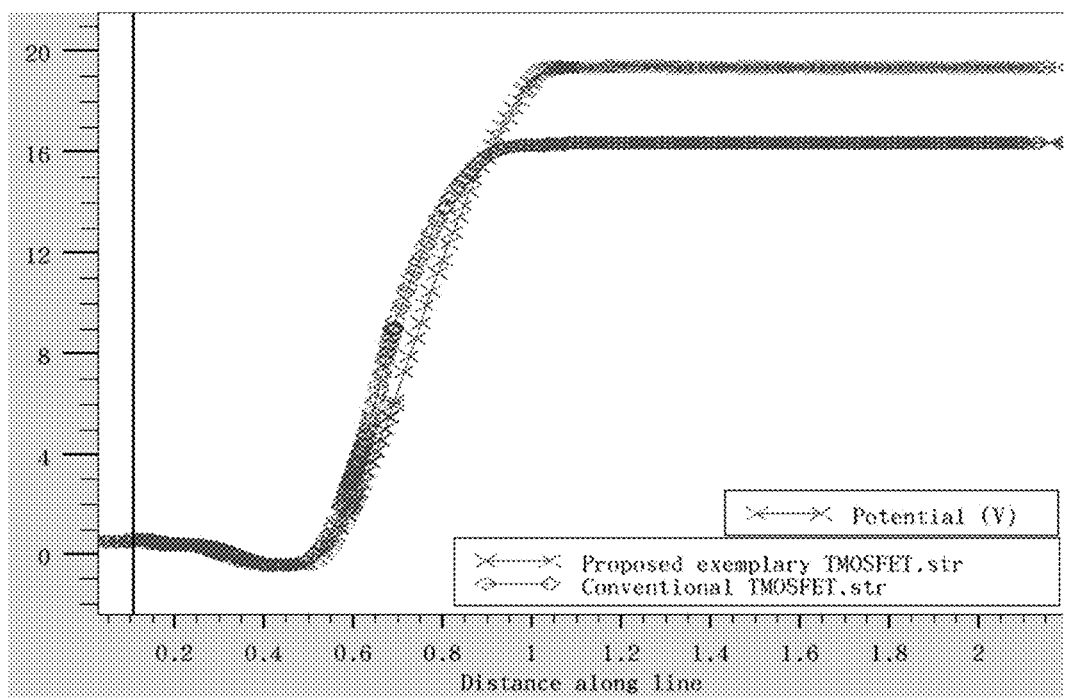
FIG. 9 shows the potential drop along cutlines AA', BB' of the exemplary TMOSFET (FIG. 4) and conventional TMOSFET (FIG. 5) respectively, and for both of which the blocking voltage is greater than their breakdown voltage.
Figure 10:
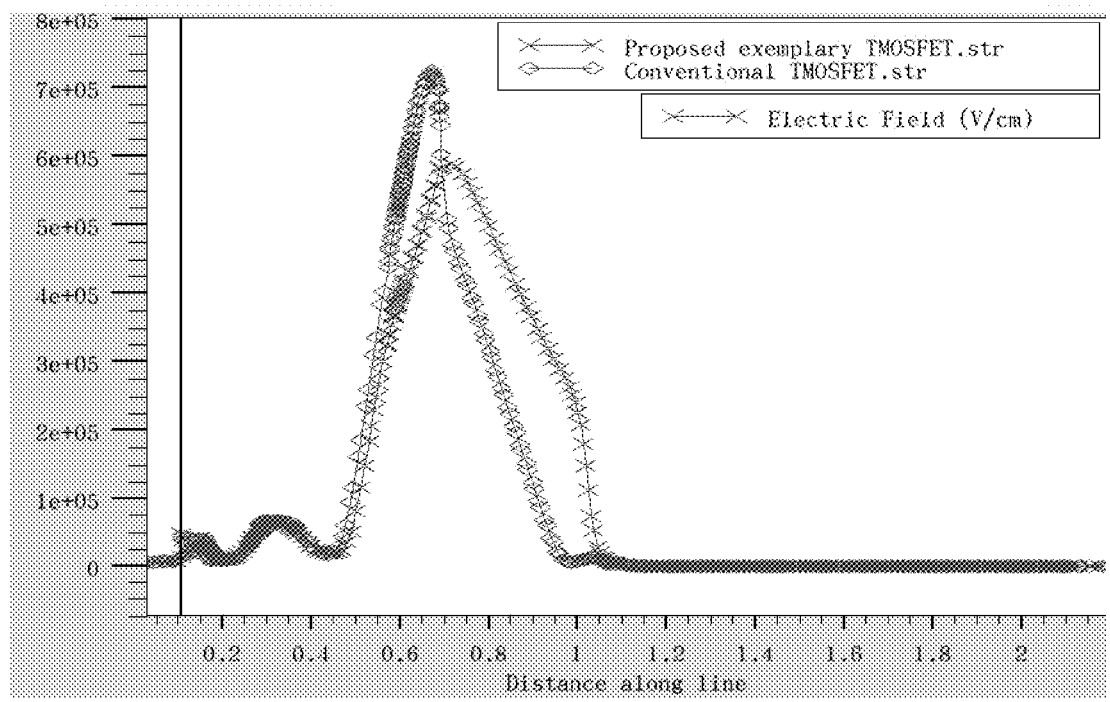
FIG. 10 shows the total electric field along cutlines AA', BB' of the exemplary TMOSFET (FIG. 4) and conventional TMOSFET (FIG. 5) respectively, and for both of which the blocking voltage greater than their breakdown voltage.
Figure 11:
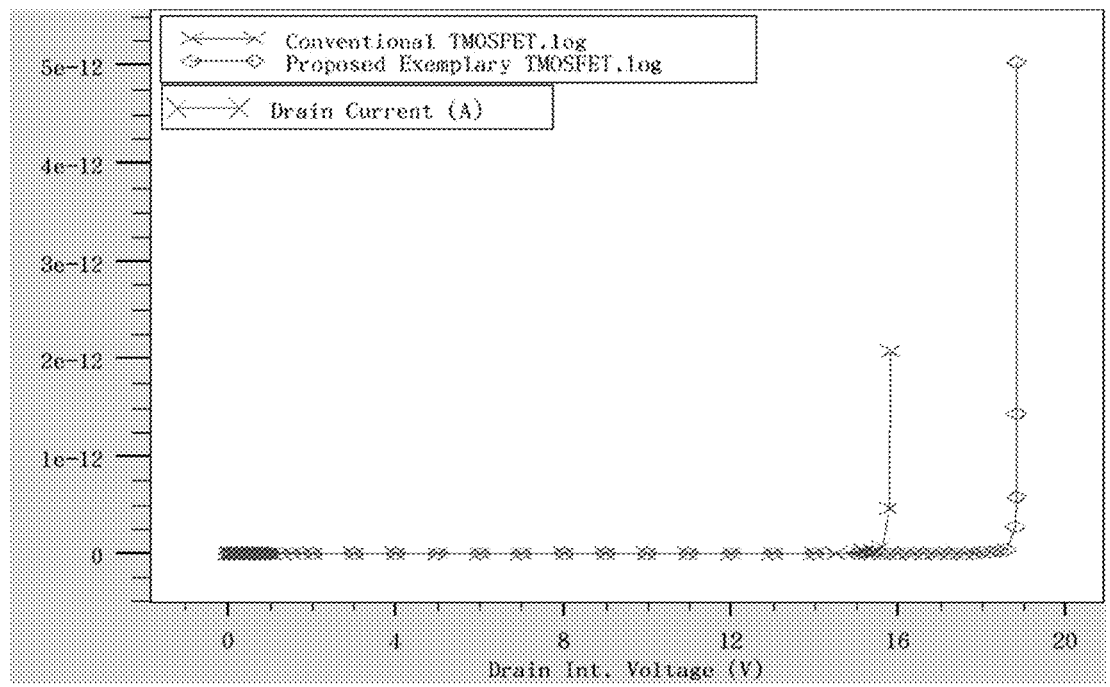
FIG. 11 shows the OFF state drain-source voltage $V_{DS}$ and current $I_{DS}$ curves A and B for the exemplary TMOSFET (FIG. 4) and conventional TMOSFET (FIG. 5) respectively.
Figures 12, 13:
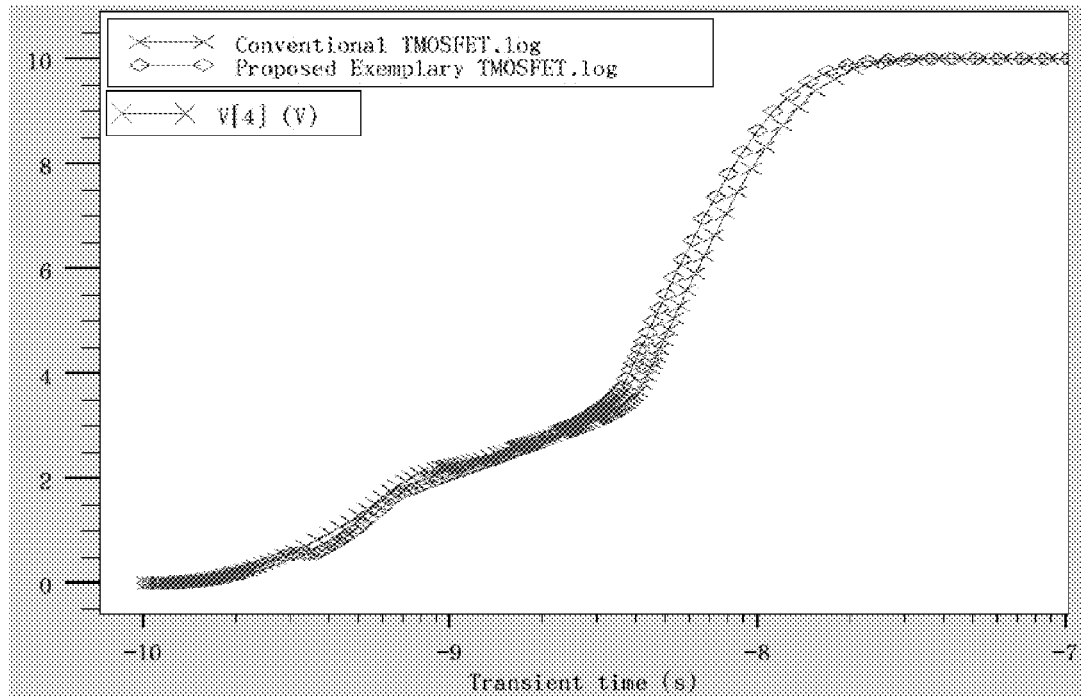
FIG. 12 shows the gate charge waveforms for the exemplary TMOSFET (FIG. 4) and conventional TMOSFET (FIG. 5) respectively.
FIG. 13 compares the drift region doping, breakdown voltage and specific ON-state resistance of the exemplary TMOSFET (FIG. 4) and TMOSFET (FIG. 5) according to conventional art.

Referring now to FIG. 9, the potential drop under breakdown conditions along cutline AA' in FIG. 4 and along cutline BB' in FIG. 5 are compared. The exemplary TMOSFET having a 0.3 µm mesa width has a breakdown voltage of approximately 19V, where as conventional TMOSFET with same doping profile has a lower breakdown voltage of approximately 16V. As seen from FIG. 10, which gives electric field as a function of device depth in microns along cutlines AA'(FIG. 4) and BB' (FIG. 5), most of the voltage is supported across the drift regions. It is worth noting that the body regions support very small or almost no voltage in this structure. As shown in FIGS. 9 and 10, most of the voltage may be supported by the drift regions and more of the peak electric field is at plane toward the bottom of the thick oxide. FIG. 11 shows the OFF state drain-source voltage $V_{DS}$ and current $I_{DS}$ curves A and B for the exemplary TMOSFET (FIG. 4) and conventional TMOSFET (FIG. 5) respectively. FIG. 12 shows the gate charge waveforms for the exemplary TMOSFET (FIG. 4) and conventional TMOSFET (FIG. 5) respectively. FIG. 13 compares the drift region doping, breakdown voltage and specific ON-state resistance of the exemplary TMOSFET (FIG. 4) and TMOSFET (FIG. 5) according to conventional art.

Figure 14A:
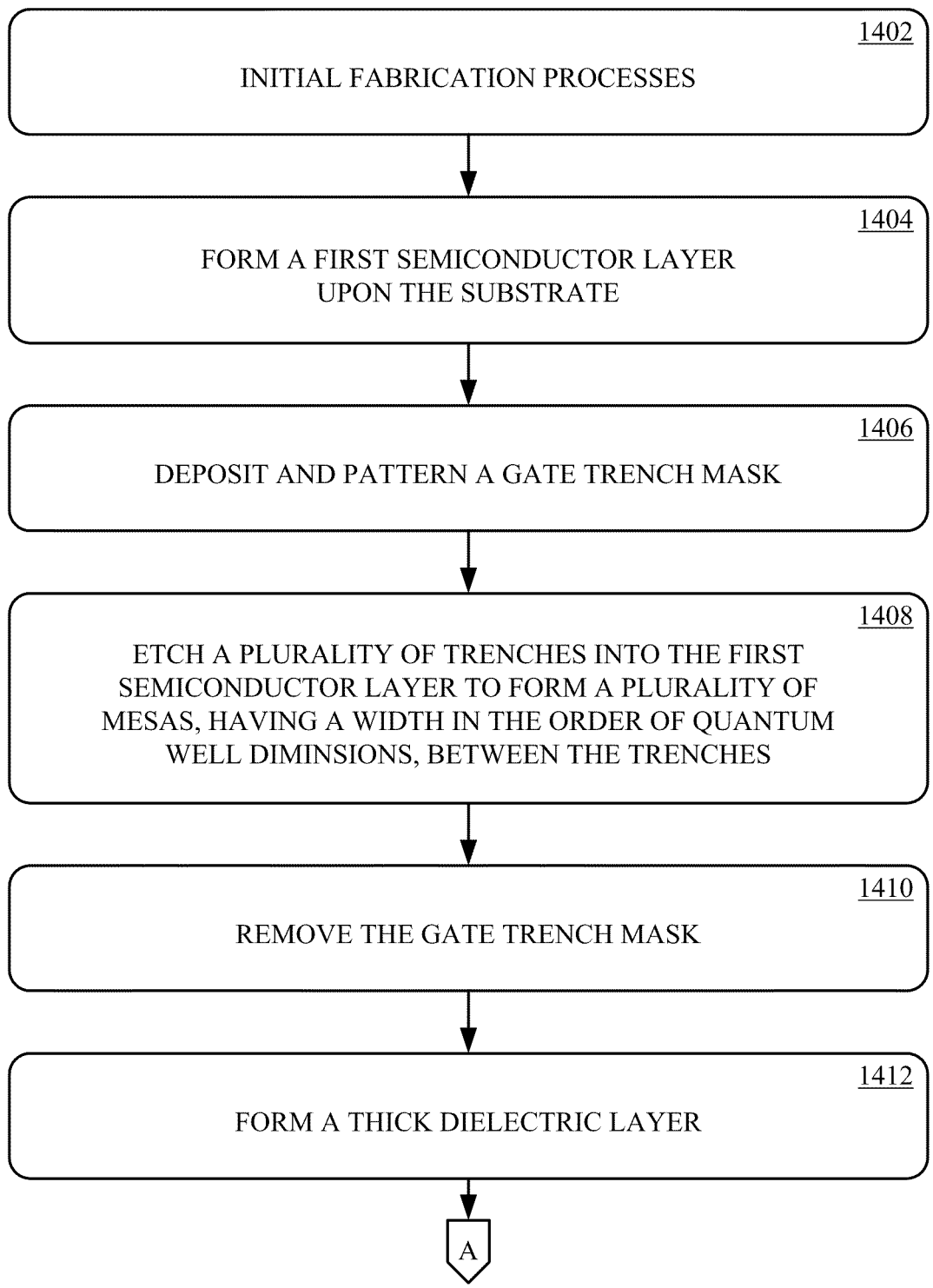
FIGS. 14A-14C show a flow diagram of a method of fabricating a TMOSFET, in accordance with one embodiment of the present technology.
Figure 14B:
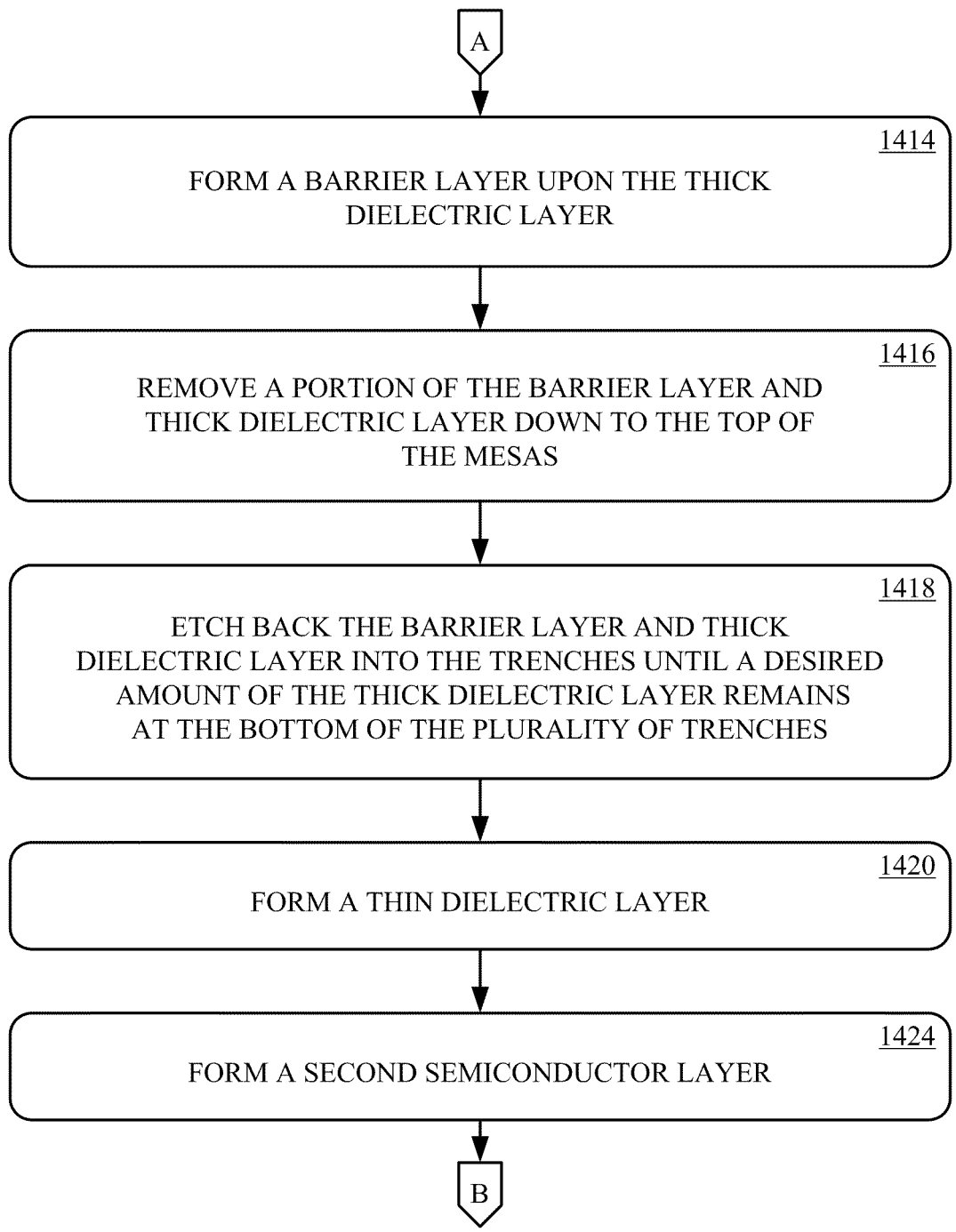
Figure 14C:
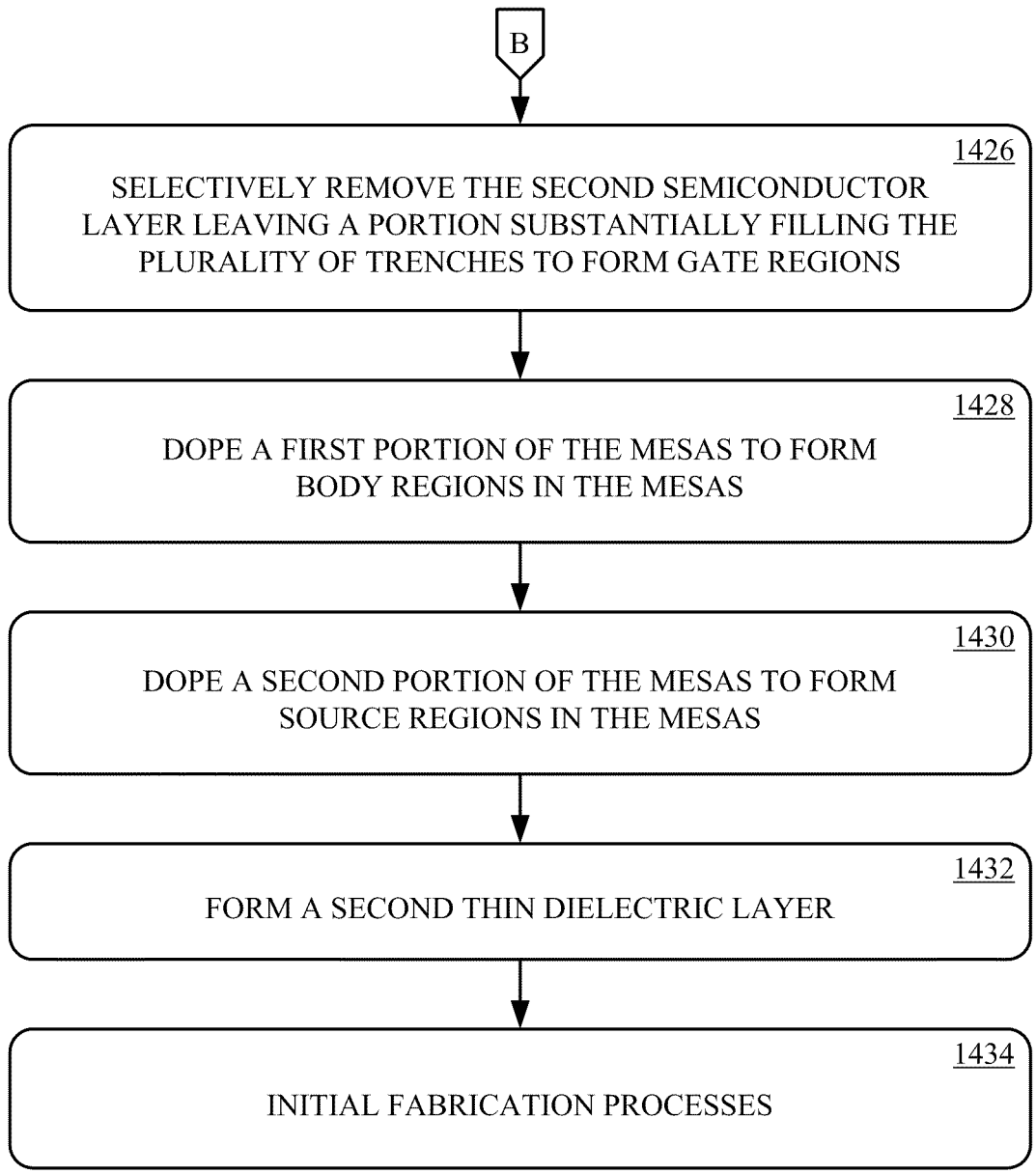
Figure 15A:
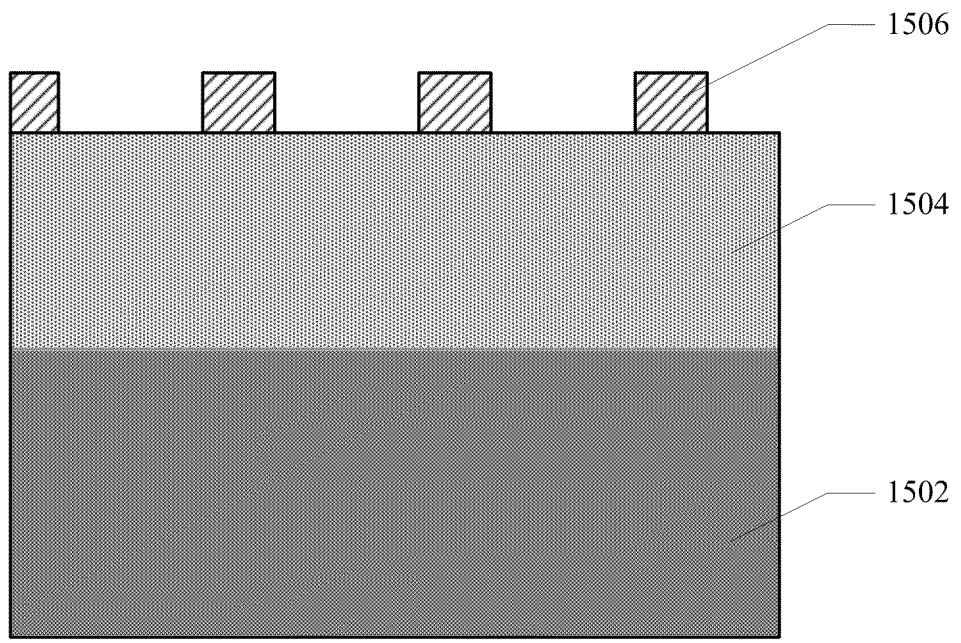
FIGS. 15A-15J show a block diagram illustrating a method of fabricating a TMOSFET, in accordance with one embodiment of the present technology.

Referring now to FIGS. 14A-14C, a method of fabricating a trench metal-oxide-semiconductor field effect transistor (TMOSFET), in accordance with one embodiment of the present technology, is shown. The method of fabricating the TMOSFET, in accordance with one embodiment of the present technology, is illustrated in FIGS. 15A-15J. As depicted in FIGS. 14A and 15A, the process begins, at 1402, with various initial processes upon a semiconductor wafer substrate 1502, such as cleaning, depositing, doping, etching and/or the like. The substrate is a semiconductor relatively heavily doped with a first type of dopant. The semiconductor substrate forms the drain region. In one implementation, the drain region may be silicon heavily doped with phosphorous (N+).

At 1404, a first semiconductor layer 1504 is formed upon the wafer substrate 1502. In one implementation, the semiconductor layer is epitaxial deposited on the substrate. In one implementation, the epitaxial deposited first semiconductor layer comprises silicon lightly doped with phosphorous (N−). The epitaxial deposited silicon may be doped by introducing the desired impurity, such as phosphorous, into the reaction chamber. In one implementation, the epitaxial layer is deposited to have a graded doping profile, wherein the doping concentration decreases from the wafer substrate to the surface of the epitaxial layer.

Figure 15B:
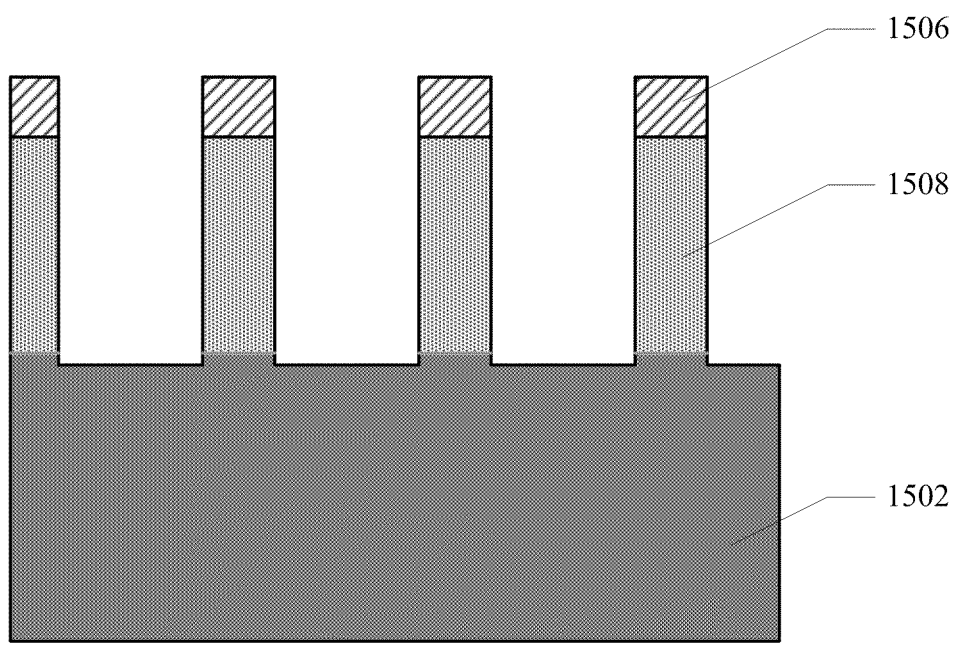

At 1406, a photo-resist is deposited and patterned 1506 by any-well know lithography process to form a gate trench mask. Referring now to FIG. 15B, the exposed portions of the first semiconductor layer are etched by any-well known isotropic etching method, at 1408. In one implementation, an ionic etchant interacts with the barrier layer, sacrificial oxide layer and first semiconductor layer exposed by the patterned resist layer. A plurality of trenches are formed having a plurality of mesas 1508 disposed between the trenches, wherein the width of the mesas is in the order of quantum well dimensions at the interface between the gate insulator regions and the mesas formed in subsequent processes. In one implementation, the width of the mesas is approximately 0.03-1.0 µm. At 1410, the gate trench mask is removed utilizing an appropriate resist stripper or a resist ashing process.

Figure 15C:
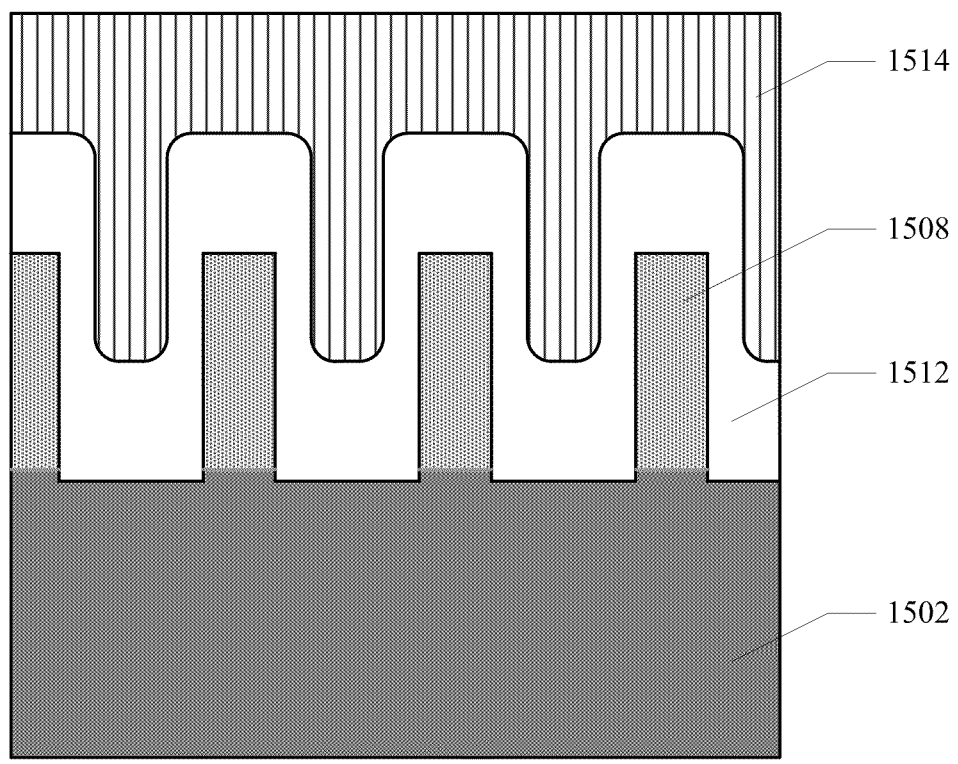

Referring now to FIG. 15C, a thick dielectric layer 1512 is formed, at 1412. In one implementation, a conformal silicon-dioxide layer is deposited by any well known method, such as chemical vapor deposition (CVD). The dielectric layer is deposited at a thickness of approximately 0.1-4.0 μm.

Figure 15D:
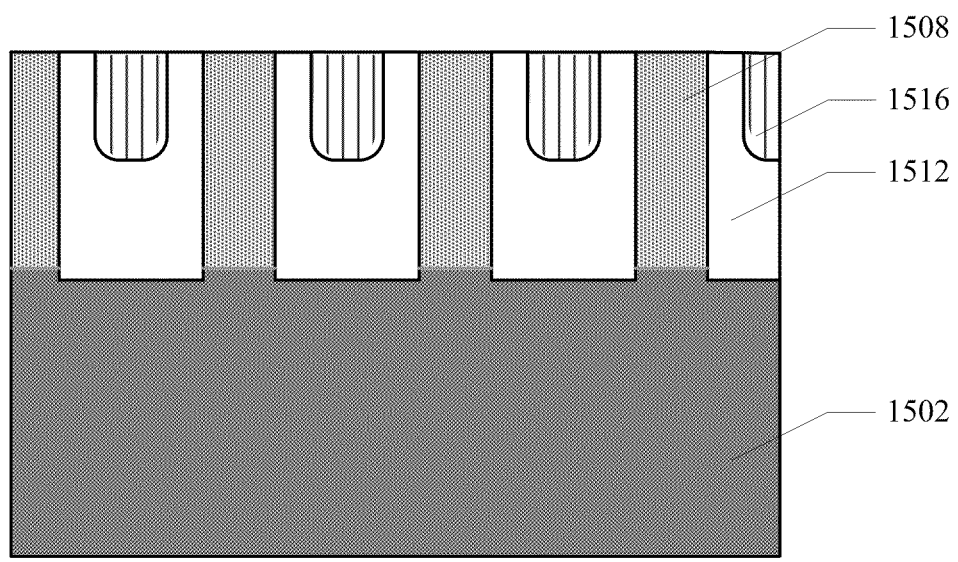
Figure 15E:
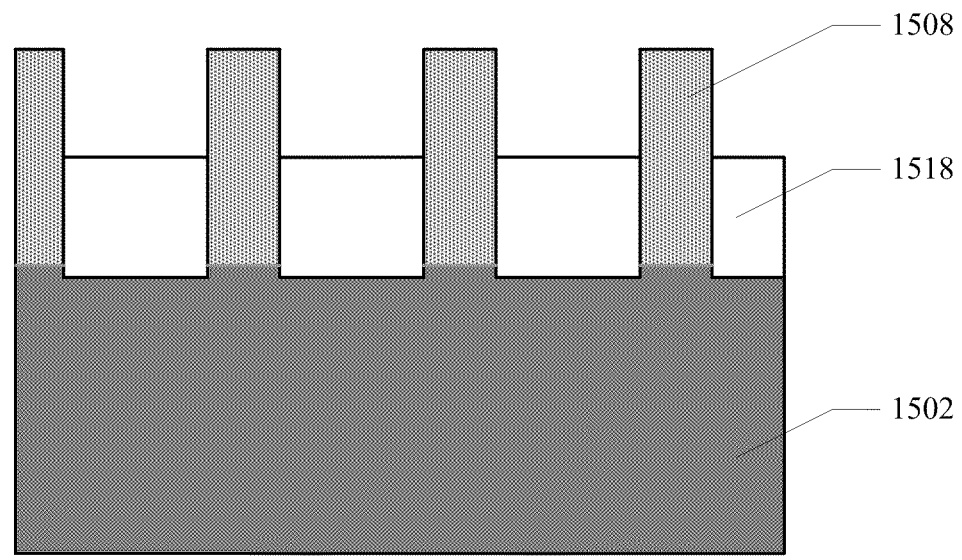

Referring now to FIG. 15C, a barrier layer 1514 is formed upon the thick dielectric layer and filing the trenches, at 1414. Referring now to FIG. 15D, a portion of the barrier layer 1514 and the thick dielectric layer 1512 is removed 1516, down to the top surface of the mesas 1508, by planarizing the wafer using chemical mechanical polishing (CMP) or any other known planarizing method, at 1416. Referring now to 15E, the remaining portion of the thick dielectric layer is etched back, into the trenches until a desired amount 1518 of the thick dielectric layer remains at the bottom of the trenches, at 1418. In one embodiment, the thick dielectric layer is etched back into the trenches until about 0.14-4.0 μm remains at the bottom of the trenches.

Figure 15F:
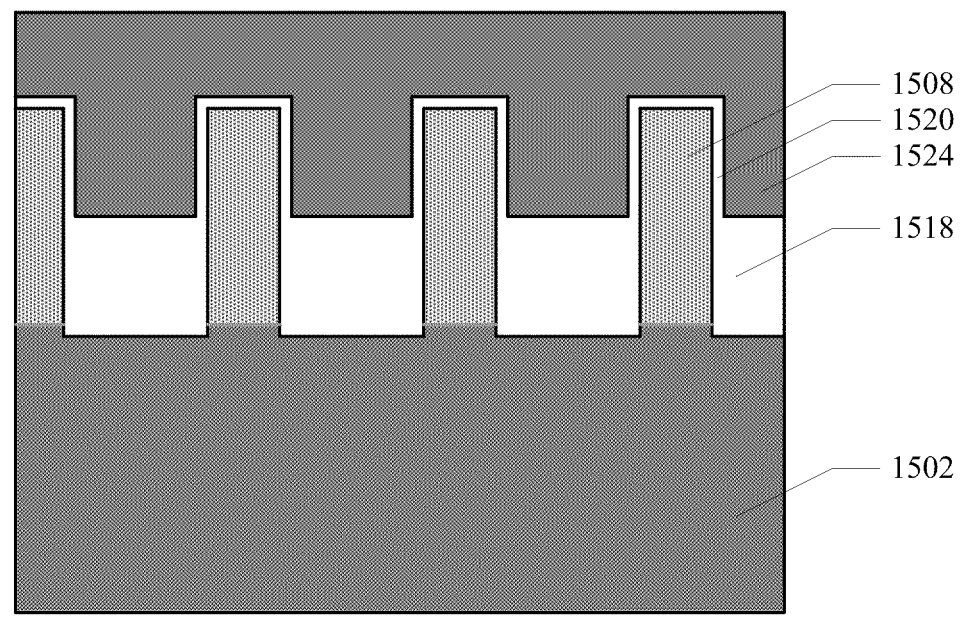

Referring now to FIG. 15F, a first thin dielectric layer 1520 is formed on the mesas, at 1420. In one implementation, the thin dielectric layer is formed by oxidizing the mesa surfaces of the first semiconductor layer to form a silicon dioxide layer.

Figure 15G:
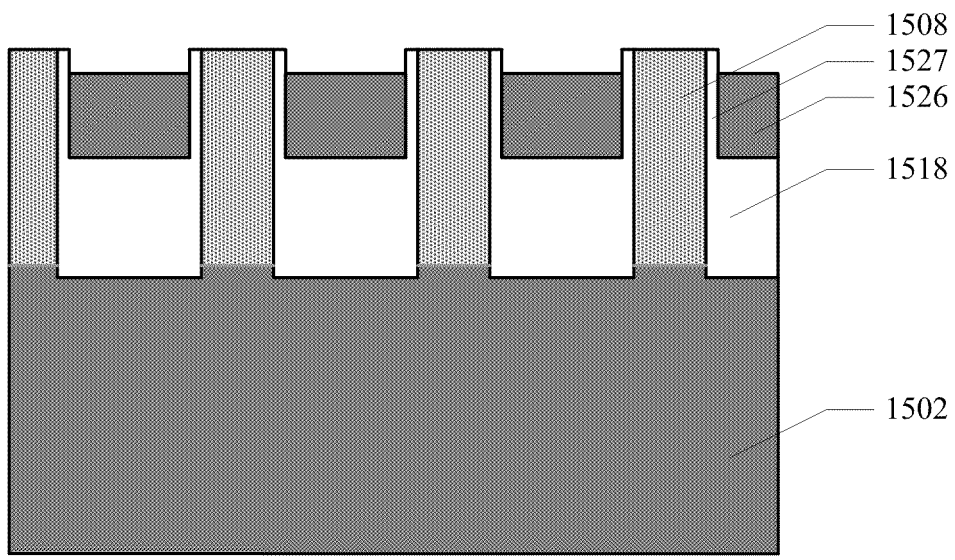

At 1424, a second semiconductor layer 1524 is formed. In one implementation, a polysilicon layer is conformally deposited on the wafer filling the trenches by a method such as decomposition of silane ($SiH_4$). In one implementation, the polysilicon is doped with n-type impurity such as phosphorous or arsenic. In one implementation, the polysilicon may be doped by introducing the impurity during the deposition process. Referring now to FIGS. 14C and 15G, an etch-back process is performed to remove excess second semiconductor layer and the thin dielectric layer on the surface of the wafer, at 1426. Removing the excess second semiconductor layer and thin dielectric layer on the surface of the wafer forms gate regions 1526, and a thin portion 1527 of the gate insulator region between the gate regions and the mesas. In one implementation, the excess second semiconductor and thin dielectric layer are selectively removed by a wet etch process or the like. In one implementation, the portion of the thin dielectric layer on the top of the mesas 1508 may be used as a hard mask during a first etching process to partially etch back the second semiconductor layer into the trenches. A second etching process may then remove the thin dielectric layer on the tops of the mesas.

Figure 15H:
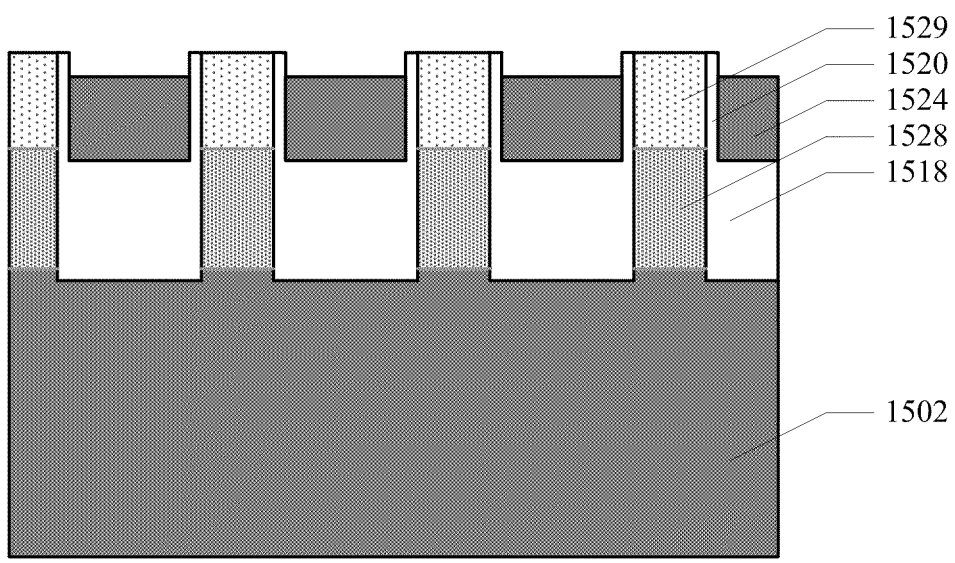

Referring now to FIG. 15H, a first portion of the mesas 1508 and the gate regions 1526 are doped with a second dopant type, to a first depth at a relatively moderate or light doping concentration, at 1428. The exposed portion of the epitaxial deposited semiconductor layer is doped to form body regions 1529 in the plurality of mesas at substantially the same depth as the gate regions. In one implementation, the doping process implants a p-type impurity, such as boron, in the mesas. A high temperature thermal cycle may be utilized to drive in the body region doping. Accordingly, the lower portion of the epitaxial deposited semiconductor layer 1528 forms lightly doped drift regions between the drain region 1502 and the body regions 1529. It is also noted that the doping of the gate regions 1524 remains substantially moderately to highly doped with a first dopant type.

Figure 15I:
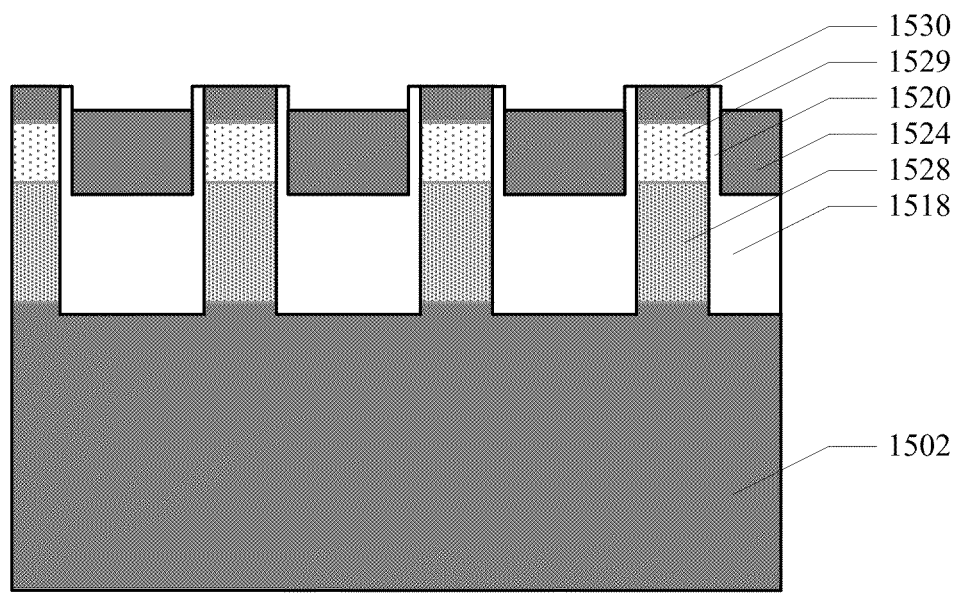
Figure 15J:
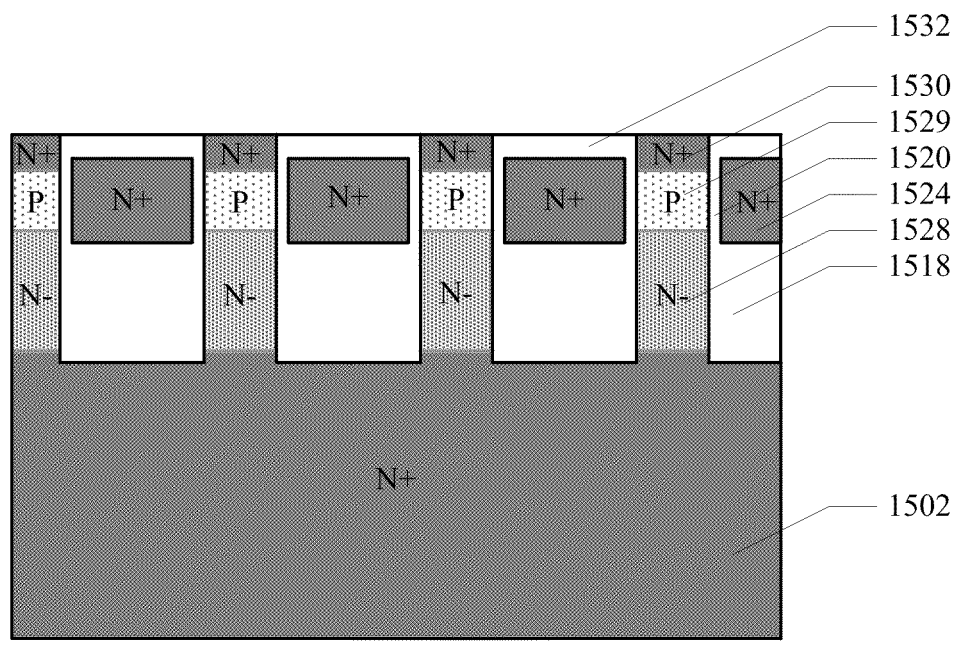

Referring now to FIG. 15I, a second portion of the mesas 1508 and the gate regions are doped with the first dopant type to a second depth at a relatively high doping concentration to form source regions 1530, at 1430. The second doping depth is less than the first doping depth. In one implementation, the doping process comprises heavily implanting an n-type impurity, such as phosphorous or Arsenic, into the plurality of mesas. A high temperature thermal cycle may be utilized to activate and/or drive in the source region doping. Referring now to FIG. 15J, a second thin dielectric layer 1532 is formed, at 1432. In one implementation, the thin dielectric is formed by oxidizing the surfaces of the mesas and gate regions to form a silicon dioxide layer.

At 1436, fabrication continues with various other processes. The various processes typically include etching, deposition, doping, cleaning, annealing, passivation, cleaving and/or the like. The additional processes for example form source/body contact openings, source/body contacts, gate contact openings, gate contacts, drain contacts, passivation layers, vias, interconnects, termination structures, peripheral structures, and/or the like.

Embodiments of the present technology advantageously achieve low ON-state resistance by taking advantage of the fringing gate-drain electric field. The doping concentration of the drift region in the mesas can advantageously be increased with less degradation of the p-n junction breakdown voltage than predicted by planar p-n junction theory. The relationship between the breakdown voltage of the p-n junction in the mesas and the doping in the mesa is advantageously controlled by the width of the mesas. In addition, the fringing field between the gate and drain in the OFF-state aids in depleting the drift region charge in the mesas, allowing a higher doping in the drift region for a given breakdown voltage. Furthermore, the thickness of the gate insulator between the gate and drain provides for substantially constant breakdown voltage even for an increased drift region doping concentration without adding additional gate charge, which results in a low ON-resistance gate charge product.

The foregoing descriptions of specific embodiments of the present technology have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the claims appended hereto and their equivalents.

What is claimed is:

1. A trench metal-oxide-semiconductor field effect transistor (TMOSFET) comprising:
   a drain region;
   a plurality of gate regions disposed above the drain region;
   a plurality of drift regions disposed in mesas between the plurality of gate regions and above the drain region;
   a plurality of body regions disposed in the mesas, above the plurality of drift regions, and disposed at substantially the same depth as from top to bottom of adjacent plurality of gate regions;
   a plurality of source regions disposed in the mesas above the plurality of body regions;
   a plurality of gate insulator regions, including:
      a thin portion disposed between the plurality of gate regions and the plurality of body regions, a thick portion disposed between the plurality of gate regions and the plurality of drift regions substantially the depth from the top to the bottom of the plurality of drift regions and between the plurality of gate regions and the drain region;

wherein the width of at least one of the mesas is approximately 0.03 to 1.0 microns (µm) and is in the order of quantum well dimension at the interface between the plurality of gate insulator regions and the plurality of body regions; and wherein a thickness of the plurality of gate insulator regions directly between the plurality of gate regions and the drain region is approximately 0.1 to 4.0 microns (µm) and is selected so that the gate-to-drain electric field in the OFF-state of the device is substantially lateral in the plurality of drift regions and impacts the breakdown voltage.

2. The trench metal-oxide-semiconductor field effect transistor (TMOSFET) of claim 1, wherein the plurality of drift regions comprise a graded doping profile decreasing vertically from the drain region to the plurality of body regions or varying laterally from edges of one of the mesas to a center of another of the mesas.

3. The trench metal-oxide-semiconductor field effect transistor (TMOSFET) of claim 1, wherein a p-n junction is formed in the mesas using the drain region.

4. The trench metal-oxide-semiconductor field effect transistor (TMOSFET) of claim 1, wherein the plurality of source regions and the plurality of body regions are coupled at substantially the same electrical potential.

5. The trench metal-oxide-semiconductor field effect transistor (TMOSFET) of claim 1, wherein doping of the plurality of drift regions have a p-n junction breakdown voltage degradation less than that predicted by planar p-n junction theory.

6. The trench metal-oxide-semiconductor field effect transistor (TMOSFET) of claim 1, wherein a relationship between breakdown voltage of a p-n junction in the mesas and a doping in the mesas is controlled by the width of the mesas.

7. The trench metal-oxide-semiconductor field effect transistor (TMOSFET) of claim 1, wherein a fringing field between the gate regions and the drain region in an OFF-state aid in depleting a charge in the plurality of drift regions in the mesas allowing a higher doping in the plurality of drift regions for a substantially constant breakdown voltage.

8. The trench metal-oxide-semiconductor field effect transistor (TMOSFET) of claim 1, wherein the thickness of the plurality of gate insulator regions between the plurality of gate regions and the drain region provides for a substantially constant breakdown voltage even for an increased drift region doping concentration without adding additional gate charge, which results in a low ON-resistance gate charge product.

9. The trench metal-oxide-semiconductor field effect transistor (TMOSFET) of claim 1, wherein:
the drain region comprises a heavily n-doped semiconductor;
the plurality of gate regions comprise an n-doped semiconductor;
the plurality of drift regions comprise a lightly n-doped semiconductor;
the plurality of body regions comprise a moderately p-doped semiconductor; and
the plurality of source regions comprise a heavily n-doped semiconductor.

10. The trench metal-oxide-semiconductor field effect transistor (TMOSFET) of claim 1, wherein:
the drain region comprises a heavily n-doped semiconductor;
the plurality of gate regions comprise an n-doped semiconductor;
the plurality of drift regions comprise a lightly to moderately n-doped semiconductor from the body regions to the drain region;
the plurality of body regions comprise a moderately p-doped semiconductor; and
the plurality of source regions comprise a heavily n-doped semiconductor.

11. The trench metal-oxide-semiconductor field effect transistor (TMOSFET) of claim 1, wherein the plurality of gate insulator regions comprise an oxide.

12. A trench metal-oxide-semiconductor field effect transistor (TMOSFET) comprising:
a drain region;
at least one gate region;
at least one mesa, each including a drift region and a body region; and
at least one gate insulator region, including:
a thin portion disposed between at least one of the gate regions and at least one of the body regions,
a thick portion disposed between at least one of the gate regions and at least one of the drift regions substantially the depth from the top to the bottom of at least one of the drift regions and between at least one of the gate regions and at least one of the drain regions,
wherein a thickness of at least one of the gate insulator regions directly between at least one of the gate regions and the drain region is approximately 0.1 to 4.0 microns (µm) and is selected so that the gate-to-drain electric field in the OFF- state of the device is substantially lateral in at least one of the drift regions and impacts the breakdown voltage;
wherein the width of each mesa is approximately 0.03 to 1.0 microns (µm) and is in the order of quantum well dimension at the interface between at least one of the gate insulator regions and at least one of the body regions.

13. The trench metal-oxide-semiconductor field effect transistor) of claim 12, wherein the gate insulator regions comprise an oxide.

14. The trench metal-oxide-semiconductor field effect transistor (TMOSFET) of claim 12, wherein:
the drain region comprises silicon heavily doped with phosphorous or arsenic;
the drift regions comprise silicon lightly or moderately doped with phosphorous or arsenic; and
the body regions comprise silicon lightly or moderately doped with boron.

15. The trench metal-oxide-semiconductor field effect transistor (TMOSFET) of claim 14, wherein the drift regions comprise a graded doping profile decreasing from the drain region to the body regions.

16. The trench metal-oxide-semiconductor field effect transistor (TMOSFET) of claim 14, wherein a doping concentration of the drift regions is approximately 5.00E+14 to 8.00E+17 per cubic centimeters.

17. The trench metal-oxide-semiconductor field effect transistor (TMOSFET) of claim 16, wherein the width of the mesas is approximately 0.03 to 2.0 microns (um).

18. The trench metal-oxide-semiconductor field effect transistor (TMOSFET) of claim 17, wherein the thickness of the gate insulator regions between the gate regions and the drain region is approximately 0.1 to 4.0 microns (um).

19. The trench metal-oxide-semiconductor field effect transistor (TMOSFET) of claim 18, wherein a breakdown voltage is approximately 15V to 55V.

20. The trench metal-oxide-semiconductor field effect transistor (TMOSFET) of claim 18, wherein a ON-state resistant is approximately 2 to 9 milli-ohms per square millimeter (mohm.mm2).

* * * * *